(12) United States Patent
Zundel

(10) Patent No.: US 11,664,416 B2
(45) Date of Patent: May 30, 2023

(54) SEMICONDUCTOR DEVICE WITH A DOPANT SOURCE

(71) Applicant: Infineon Technologies AG, Neubiberg (DE)

(72) Inventor: Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 33 days.

(21) Appl. No.: 16/568,911

(22) Filed: Sep. 12, 2019

(65) Prior Publication Data

US 2020/0091284 A1 Mar. 19, 2020

(30) Foreign Application Priority Data

Sep. 17, 2018 (DE) .......................... 102018122739.6

(51) Int. Cl.
*H01L 29/06* (2006.01)
*H01L 29/423* (2006.01)
*H01L 29/08* (2006.01)

(52) U.S. Cl.
CPC ...... *H01L 29/0634* (2013.01); *H01L 29/0847* (2013.01); *H01L 29/4236* (2013.01)

(58) Field of Classification Search
CPC ..................... H01L 29/00–86; H01L 29/0634
See application file for complete search history.

(56) References Cited

U.S. PATENT DOCUMENTS

| 5,003,365 A * | 3/1991 | Havemann .......... H01L 21/2257 257/514 |
| 2006/0118862 A1* | 6/2006 | Hirler ............... H01L 29/66666 257/330 |
| 2007/0296010 A1* | 12/2007 | Su ....................... H01L 27/1087 257/301 |
| 2012/0267708 A1* | 10/2012 | Lin ....................... H01L 29/423 257/330 |
| 2012/0292687 A1* | 11/2012 | Lin ................... H01L 29/66734 257/329 |
| 2013/0043528 A1* | 2/2013 | Lin ................... H01L 29/66734 257/330 |
| 2013/0082324 A1* | 4/2013 | Lin ................... H01L 29/41766 257/E27.06 |

(Continued)

FOREIGN PATENT DOCUMENTS

| DE | 4404757 A1 | 8/1995 |
| DE | 19743342 C2 | 2/2002 |

(Continued)

*Primary Examiner* — Eric K Ashbahian
(74) *Attorney, Agent, or Firm* — Murphy, Bilak & Homiller, PLLC

(57) ABSTRACT

A semiconductor device includes a semiconductor body having a first surface. A first trench extends in a vertical direction into the semiconductor body. The semiconductor device also includes a first interlayer in the first trench and a first dopant source in the first trench. The first interlayer is arranged between the first dopant source and the semiconductor body, and the first dopant source includes a first dopant species. The semiconductor device also includes a semiconductor area doped with the first dopant species and which completely surrounds the first trench at least at a depth in the semiconductor body and adjoins the first trench.

17 Claims, 5 Drawing Sheets

(56) References Cited

U.S. PATENT DOCUMENTS

| | | | | |
|---|---|---|---|---|
| 2014/0084362 A1* | 3/2014 | Schloesser | .......... | H01L 29/7803 |
| | | | | 257/330 |
| 2015/0035051 A1* | 2/2015 | Hebert | ................ | H01L 29/0878 |
| | | | | 257/334 |
| 2015/0087129 A1* | 3/2015 | Konrath | ................ | H01L 29/872 |
| | | | | 438/305 |
| 2015/0108620 A1* | 4/2015 | Weber | ................... | H01L 21/465 |
| | | | | 257/655 |
| 2015/0372131 A1* | 12/2015 | Hebert | ................ | H01L 29/0623 |
| | | | | 257/330 |
| 2017/0092717 A1* | 3/2017 | Meiser | ................ | H01L 29/7811 |
| 2017/0125580 A1* | 5/2017 | Kowalik-Seidl | .... | H01L 29/0634 |
| 2018/0374919 A1* | 12/2018 | Tilke | .................. | H01L 21/31155 |
| 2020/0168714 A1* | 5/2020 | Oda | ........................ | H01L 24/45 |

FOREIGN PATENT DOCUMENTS

| | | |
|---|---|---|
| DE | 102004052643 A1 | 5/2006 |
| DE | 102013108473 A1 | 2/2014 |

* cited by examiner

SEMICONDUCTOR DEVICE WITH A DOPANT SOURCE

TECHNICAL FIELD

The present application relates to semiconductor devices, especially semiconductor switches with a low on resistance.

BACKGROUND

The technological development of semiconductor components, for instance insulated gate field effect transistors (IGFETs), e.g. MOSFETs (metal oxide semiconductor field effect transistors), is pursuing the aim of reducing area-specific on resistance. Even though a component property, for example area-specific on resistance, can be improved by varying a particular component parameter, for example a drift zone dopant concentration, this can lead to a simultaneous deterioration in another component property, for example barrier voltage resistance in the form of a breakdown resistance VDS between source and drain. Thus, the component parameters, within the scope of technological development, are fixed by a multitude of compromises between component properties such that the target parameters of the component specification are met.

Semiconductor devices with an improved area-specific on resistance are desirable.

SUMMARY

The present disclosure relates to a semiconductor device. The semiconductor device includes a semiconductor body having a first surface. The semiconductor body additionally has a first trench that extends in a vertical direction into the semiconductor body. The semiconductor device has a first interlayer and a first dopant source in the first trench. The first interlayer is disposed between the first dopant source and the semiconductor body, and the first dopant source includes a first dopant species. The semiconductor device additionally includes a semiconductor area which is doped with the first dopant species and which completely surrounds the first trench at least at one depth in the semiconductor body and adjoins the first trench.

Further features and advantages of the subject matter disclosed will be apparent to the person skilled in the art from the detailed description that follows and from the drawings.

BRIEF DESCRIPTION OF THE DRAWINGS

The appended drawings impart a deeper understanding of working examples of a semiconductor component, are incorporated into the disclosure and form part thereof. The drawings merely illustrate working examples and, together with the description, serve to elucidate the principles thereof. The semiconductor described here is thus not limited thereto by the description of the working examples. Further working examples and intended advantages are apparent from the understanding of the detailed description that follows and from combinations of the working examples described hereinafter, even if these are not described explicitly. The elements and structures shown in the drawings are not necessarily shown true to scale with respect to one another. Identical reference numerals refer to identical or corresponding elements and structures.

DETAILED DESCRIPTION

Figure 1:
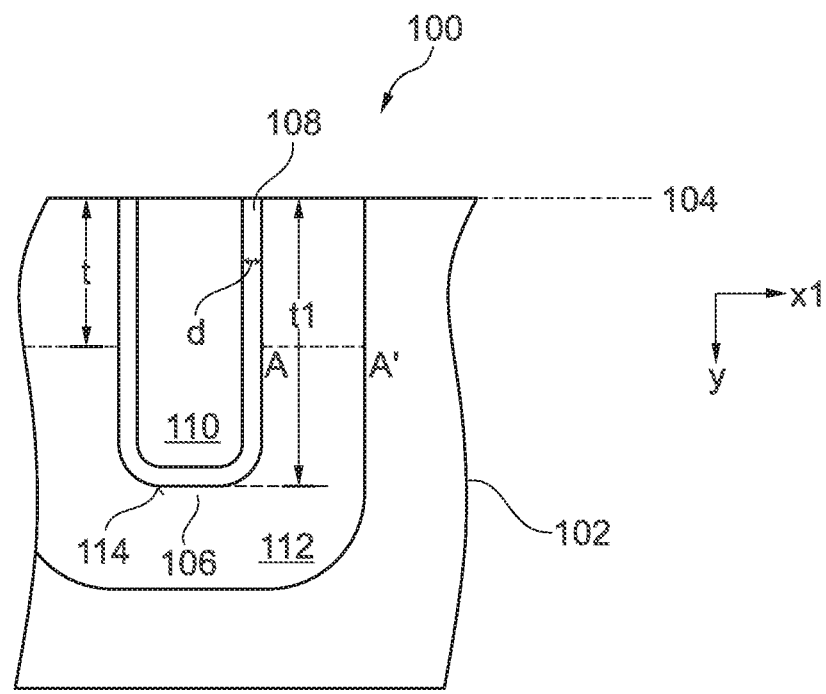
FIG. 1 is a schematic cross-sectional view of a semiconductor body for illustration of a semiconductor device with a dopant trench in one working example.

The detailed description that follows refers to the accompanying drawings, which form part of the disclosure and which show specific working examples of a semiconductor component for illustration purposes. The existence of further working examples will be self-evident. It will likewise be self-evident that structural and/or logical alterations can be made to the working examples without departing from what has been defined by the patent claims. The description of the working examples is nonlimiting in that respect. More particularly, features of working examples described hereinafter can be combined with features of other working examples described unless the opposite is apparent from the context.

The terms "have", "contain", "comprise", "include" and the like hereinafter are nonlimiting expressions that on the one hand point out the presence of said elements or features, but on the other hand do not rule out the presence of further elements or features. The indefinite articles and the definite articles include both the plural and singular, unless the opposite is clearly apparent from the context.

The term or expression "electrically connected" describes an ohmic, i.e. low-resistance, connection between the electrically connected elements, for example direct contact between the elements in question or a connection via a metal and/or a highly doped semiconductor. The expression "electrically coupled" includes the possibility of the presence of one or more intermediate elements suitable for signal transmission between the "electrically coupled" elements, for example elements controllable in such a way that they can at different times establish a low-resistance connection in a first state and a high-resistance decoupling in a second state.

If a range of values with the specification of one limit or two limits is defined for a physical parameter, the terms "from" and "to" or "less than" and "more than" include the respective limit. An expression of the kind "from . . . to" is accordingly considered to mean "from at least . . . to at most". Correspondingly, an expression of the kind "less than . . ." ("more than . . .") is considered to mean "at most . . ." ("at least . . .").

The abbreviation IGFET (insulated gate field effect transistor) refers to the voltage-controlled semiconductor switches and includes, as well as MOSFETs (metal oxide semiconductor FETs), also those FETs wherein the gate electrode includes doped semiconductor material and/or wherein the gate dielectric does not include an oxide or does not consist exclusively of an oxide.

A safe operating area (SOA) defines ambient and operating conditions for which failsafe operation of a semiconductor component can be expected. Typically, the safe operating area is defined by specification of maximum values for ambient and operating conditions in a datasheet for the semiconductor component, called the component specification, for example maximum sustained load current, maximum pulsed load current, maximum gate voltage, maximum barrier voltage inter alia.

One working example relates to a semiconductor device. The semiconductor device includes a semiconductor body having a first surface. A first trench may extend in a vertical direction into the semiconductor body. A first interlayer and a first dopant source may be disposed in the first trench. The first interlayer may be disposed between the first dopant source and the semiconductor body. For example, the first interlayer may line the first trench and the dopant source may at least partly, i.e. partly or completely, fill the trench. The first dopant source may include a first dopant species. A dopant species refers to a p/n dopant element. In a semiconductor body, for instance silicon, a dopant element such as, for instance, boron (B) or indium (In) or aluminum (Al) or gallium (Ga) results in establishment of p-type doping, while phosphorus (P) or arsenic (As) or antimony (Sb) results in establishment of n-type doping. Since the semiconductor body, rather than silicon, may also be formed from other semiconductor materials, the dopant species mentioned above by way of example for silicon may also be different. The semiconductor device additionally has a semiconductor area which is doped with the first dopant species and which completely surrounds the first trench at least at one depth in the semiconductor body and adjoins the first trench. The first trench can be completely surrounded by the semiconductor area at least at one depth in that, for example, the semiconductor area adjoins both a base and lateral faces of the first trench. In this case, the first trench would be surrounded completely by the semiconductor area at all depths. It is likewise possible for the semiconductor area to completely surround the first trench only in a first depth region, i.e. a first region of vertical extent or multiple first depth regions, and, for example, not to be present, i.e. to be absent, in a second depth region or in multiple second depth regions of the first trench. The semiconductor area likewise may or may not adjoin the first trench in the base region. The configuration of the first semiconductor area can be achieved via diffusion of the dopant species out of the dopant source through the interlayer into the semiconductor body, for example by contacting of the semiconductor body with a thermal budget in a device suitable for the purpose, for instance an oven. By virtue of the dopant source being recessed in a particular depth region of the first trench and/or by virtue of positioning of a diffusion barrier layer between dopant source and semiconductor body and optional variation in thickness in vertical direction, it is possible, for example, to establish the configurations of the semiconductor area that have been described by way of example further up and further configurations. In a further working example, the first trench adjoins a further trench, for example a trench containing a gate electrode. In this case, the semiconductor area only partly surrounds the first trench.

The first trench may thus be a doped trench from which tightly defined dopant profiles in the adjacent semiconductor body can be established by controlled lateral outward diffusion, these being independent, for example, of coating thickness limits in the case of oblique implantation processes into deep trenches. This enables the production of more compact components and hence a reduction in the area-specific on resistance RDS (on).

A further working example relates to a semiconductor device in which a concentration profile of the first dopant species in the first semiconductor area, in a first lateral direction that extends from the first trench into the semiconductor body, corresponds to a diffusion profile that results from diffusion of the first dopant species out of the dopant source through the interlayer into the semiconductor body. For example, the dopant profile declines in a lateral direction at right angles to a lateral face of the first trench over an entire lateral extent or over a predominant proportion of the entire lateral extent; for example, a dopant concentration of the first dopant species decreases with increasing lateral distance from the first trench. By skillful positioning of the first trench that acts as a dopant trench relative to further component structures, for instance a gate trench sidewall at which a gate-controlled channel conductivity is to be established in component operation, this enables adjustment of component parameters in a very tight space. It is also possible for semiconductor areas to be formed so as to be self-adjusting with respect to one another, in that these areas are diffused out of trenches positioned relative to one another. For example, a threshold voltage Vth of a MOSFET channel, in spite of compact component geometry and trench depths in the region of several micrometers or several tens of micrometers, can be established via skillful positioning of the first trench relative to a gate trench, by generating a dopant profile of a body area by diffusion of a dopant species, for example boron, out of a side wall of the first trench into the surrounding semiconductor body. For example, a minimum lateral dimension of the first trench at the first surface may be within a range from 20 nm to 200 nm and a vertical extent of the first trench may be within a range from 0.5 µm to 50 µm. Thus, for example, it is possible to achieve semiconductor devices in which there is an aspect ratio of 1:4 or greater.

A further working example relates to a semiconductor device in which the maximum lateral dimension of the first trench at the first surface is less than a vertical extent of the first trench from the first surface up to a trench base. Thus, the first trench can assume the form, for example, of a needle or a column. At the first surface, the first trench may have, for example, a round shape or elliptical shape or else a shape of a polygon, for example of an equilateral or regular polygon such as a rectangle or hexagon. For example, a minimum lateral dimension lmin of the first trench at the first surface may be within a range from 5% to 100%, or from 10% to 100%, or from 30% to 100%, or from 50% to 100%, of the maximum lateral dimension lmax at the first surface. In the case of a round geometry of the first trench at the first surface, for example, it is possible to establish a radially symmetric concentration of the first dopant species.

A further working example relates to a semiconductor device in which the interlayer has at least one oxide layer having a thickness within a range from 1 nm to 20 nm and the interlayer lines the first trench. The oxide layer may, for example, be a thermally grown oxide layer or else a deposited oxide layer, for example a conformally deposited oxide such as a CVD oxide (oxide from chemical vapor deposition) or LPCVD oxide (oxide from low-pressure chemical vapor deposition). It is also possible for the oxide to be part of a layer stack, for example of an ONO (oxide-nitride-oxide) stack. Rather than oxide or in addition to an oxide, it is possible to use further materials that bring about a desired inhibition or barrier with regard to the diffusion of the dopant species out of the first trench into the surrounding semiconductor body.

A further working example relates to a semiconductor device in which the dopant source includes polycrystalline silicon doped with the first dopant species. By virtue, for example, of the dopant concentration being varied in the vertical direction, for example by ion implantation with different dose and energy, it is also possible to influence and establish a vertical dopant profile after the diffusion out of the first trench into the semiconductor area. As well as polycrystalline silicon as dopant source, it is alternatively or additionally possible to use further materials that are suitable as dopant source. For example, it is possible to use doped glasses, for instance boron-doped silicon glass (BSG, borosilicate glass), phosphorus-doped silicate glass (PSG, phosphosilicate glass), or else boron- and phosphorus-doped silicate glass (BPSG, borophosphosilicate glass).

In a further working example, the semiconductor device is a field-effect transistor device, for example a MOSFET, and the first semiconductor area is an n-doped or p-doped area of a superjunction structure, or a source area, or a body area, or a body contact area. The MOSFET may, for example, be a lateral FINFET. In the case of a superjunction structure, there is alternation of n-doped and p-doped regions in a lateral direction. It is possible here for both oppositely doped areas of the superjunction structure, i.e. the n- and p-doped area, to be diffused out of trenches, or else just one of these areas. If both areas are diffused out of trenches, the diffusion into the first area, for example a p-doped area, may be from the first trench and the diffusion into the second area, for example a n-doped area, from a second trench. In a further working example, the diffusion of the n- and p-dopant species is from the first trench, i.e. one and the same trench, and the superjunction structure may be produced, for example, with inclusion of different coefficients of diffusion of the n- and p-dopant species and by matching with the dopant doses in the source material and the thermal budget in the outward diffusion. It is of course also possible to produce n- and p-doped areas other than areas of a superjunction structure from one and the same trench as described above. It is likewise possible, for example, to produce body area, source area and optionally a body contact area from different trenches including the first trench by skillful positioning of the respective dopant trenches relative to a gate trench, for example in a self-adjusted manner relative to one another.

A further working example relates to a semiconductor device in which a thickness of the interlayer varies along the side wall in the vertical direction. In this way, it is possible, for example, to establish a maximum lateral outward diffusion and an amount of the dopant species introduced into the semiconductor body at a particular depth. For example, by omitting the interlayer, it is possible to produce a highly doped contact area at a particular depth as part of the semiconductor area that electrically connects the rest of the semiconductor area to the dopant source material in the first trench. For example, the dopant source material can be utilized as contact trench in the semiconductor device in order, for instance, to provide electrical contact with a body area via a side wall opening.

A further working example relates to a semiconductor device in which a) the first trench extends from the first surface of the semiconductor body into the semiconductor body or b) the first trench is sealed by means of a semiconductor layer at a top end of the first trench, where the semiconductor area doped with the first dopant species extends from the top end of the trench into the semiconductor layer above it. In case a) the first trench may serve, for example, to form a source area, a body area, a body contact area, and in case b) the first trench sealed by means of the semiconductor layer may serve to form a superjunction structure. In the case of a n-channel MOSFET, the p-doped areas of the superjunction structure that have been produced, for instance, by means of the dopant source in the first trench may overlap with or be electrically connected to a p-doped body area formed above it and within the semiconductor layer. The interlayer may be disposed, for example, at the top end of the trench, for example cover the first trench on the semiconductor layer side, or else be absent, in which latter case enhanced diffusion toward the top end can serve, for example, to improve an electrical contact, for example to improve an electrical connection of a p-doped column of a superjunction structure to a p-doped body area.

A further working example relates to a semiconductor device having a second trench that extends in the vertical direction into the semiconductor body. In the second trench are disposed a second interlayer and a second dopant source, where the second interlayer is disposed between the second dopant source and the semiconductor body and the second dopant source includes a second dopant species. The semiconductor device additionally comprises a second semiconductor area which is doped with the second dopant species and which completely surrounds the second trench at least at one depth in the semiconductor body and which adjoins the second trench. The statements made in connection with the first trench relating to the configuration of the first semiconductor area, for example cutout in depth regions or at the base, dopant profiles, and the structural or functional statements made in connection with the interlayer and the dopant source in the first trench can be applied directly to the second interlayer and the second dopant source. The dimensions of first trench and second trench and also the first and second dopant species may differ from one another. If first and second trenches with different dopant species are used, it is possible, for example, to produce semiconductor areas of different conductivity type, such as source areas and body areas, by means of the first and second trenches. These areas may be produced, for example, so as to be self-adjusting relative to one another in that the outward diffusion lands of the first and second dopant species are matched to the distances from the later MOS channel at a side wall of a gate trench, taking account of the thermal budget. It is likewise possible, for example, for semiconductor areas of the same conductivity type to be produced with different dopant levels, for example a body area and a comparatively more highly doped body contact area. Thus, the first dopant species may, for example, be different than the second dopant species and/or a dopant concentration of the first dopant species may be different than a dopant concentration of the second dopant species.

A further working example relates to a semiconductor device in which a concentration profile of the first dopant species can overlap with a concentration profile of the second dopant species in a lateral direction. For example, the concentration profile may be that of body area and source area, or of body area and body contact area, or of source area and body contact area, or of n- and p-doped areas of a superjunction structure.

A further working example relates to a semiconductor device having a third trench that extends in the vertical direction into the semiconductor body. It is possible for a gate structure to be formed in the third trench, where the gate structure may have a gate dielectric and a gate electrode.

A further working example relates to a semiconductor device in which the first trench and the third trench differ in a lateral extent at the first surface and/or in a vertical extent into the semiconductor body. It is likewise possible for the second trench and the third trench to differ in a lateral extent at the first surface and/or in a vertical extent into the semiconductor body. If more than two different trenches with regard to the dopant species and/or the dopant source are used as doped trenches, these trenches may differ with regard to the vertical/lateral dimensions from the third trench. With respect to one another, the more than two trenches that are different in terms of the dopant species and/or the dopant source may correspond or else differ with regard to the vertical/lateral dimensions.

A further working example relates to a semiconductor device which the semiconductor area adjoins a side wall of the third trench. For example, the semiconductor area may be a body area and it is possible in this way to adjust the threshold voltage of an MOS channel.

A further working example relates to a semiconductor device in which multiple first trenches and multiple third trenches may be arranged alternately in a first lateral direction and respective middles of the first trenches and the third trenches may be offset from one another in a second lateral direction.

A further working example relates to a semiconductor device in which multiple second trenches and multiple first trenches may be arranged alternately in the first lateral direction.

A further working example relates to a semiconductor device in which a second trench is arranged between two third trenches in the second lateral direction.

With reference to the schematic cross-sectional view in FIG. 1, a working example of a semiconductor device 100 is described by way of example. The structural and functional features described in connection with the above embodiments can be applied to the corresponding features shown in the figures that follow. So if, for example, the semiconductor area described in connection with the above embodiments is shown in the drawing, the statements made further up in connection with the configuration of this semiconductor area can be applied.

Figure 2A:
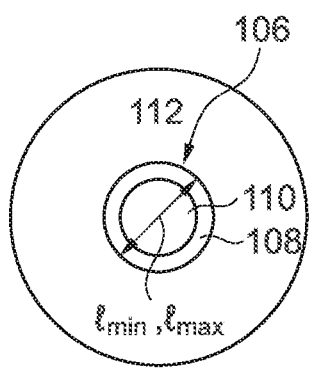
FIG. 2A-2C show illustrative top views of a first surface of the working example of FIG. 1.
Figure 2B:
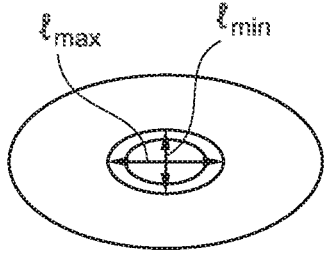
Figure 2C:
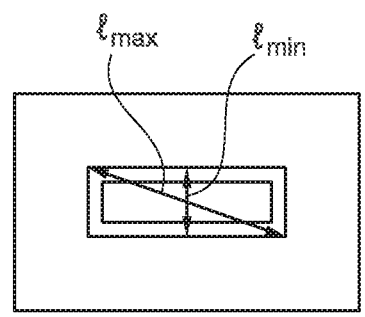

The semiconductor device 100 has a semiconductor body 102 having a first surface 104. A first trench 106 extends in a vertical direction y into the semiconductor body 102. In the first trench 106 are disposed a first interlayer 108 and a first dopant source 110. The first interlayer 108 lines the first trench 106 and is disposed between the first dopant source 110 and the semiconductor body 102. The semiconductor device additionally has a semiconductor area 112 which is doped with the first dopant species and which completely surrounds the first trench 106 at least at a depth t in the semiconductor body and adjoins the first trench 106. In the working example shown in FIG. 1, the semiconductor area 102 completely surrounds the first trench 106 at all depths. This is shown in schematic form, for example, in the top view of the first area 104 in FIGS. 2A to 2C, where these top views differ with regard to the geometry of the semiconductor area 102 on the first surface 104. By way of example, a circular shape (FIG. 2A), an elliptical shape (FIG. 2B) and a rectangular shape (FIG. 2C) are shown. A minimum lateral dimension lmin of the first trench at the first surface 104 may correspond here to a maximum lateral dimension lmax at the first surface 104 (cf. FIG. 2A) or else differ therefrom (cf. FIG. 2B and FIG. 2C). For example, the maximum lateral dimension lmax of the first trench 106 at the first surface 104 may be less than a vertical extent t1 of the first trench 106 from the first surface 104 up to a trench base (cf. FIG. 1). The aspect ratio of the trench may be 1:4 to about 1:100. At such aspect ratios, it is possible only with difficulty, if at all, to achieve well-defined dopant profiles by means of implementation methods over the side wall owing to the steepness of the angle of incidence and occurrence of scatter.

Figure 3:
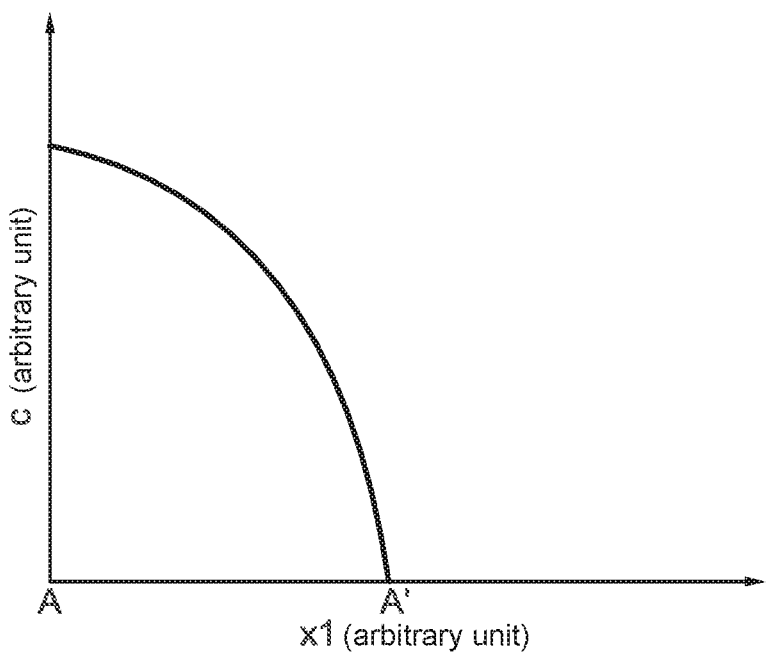
FIG. 3 is a diagram that shows an illustrative dopant profile along the line AA' of the working example of FIG. 1.

The schematic diagram in FIG. 3 shows an illustrative concentration profile c of the first dopant species in the semiconductor area 112 in a first lateral direction x1, which extends from the first trench 106 into the semiconductor body 102 along the line AA' shown in FIG. 1A. The concentration profile c corresponds to a diffusion profile that results from diffusion of the first dopant species from the dopant source 110 through the interlayer 108 into the semiconductor body 102. For example, the dopant profile declines in the first lateral direction x1 at right angles toward a lateral face of the first trench 106 over an entire lateral extent.

Figure 4:
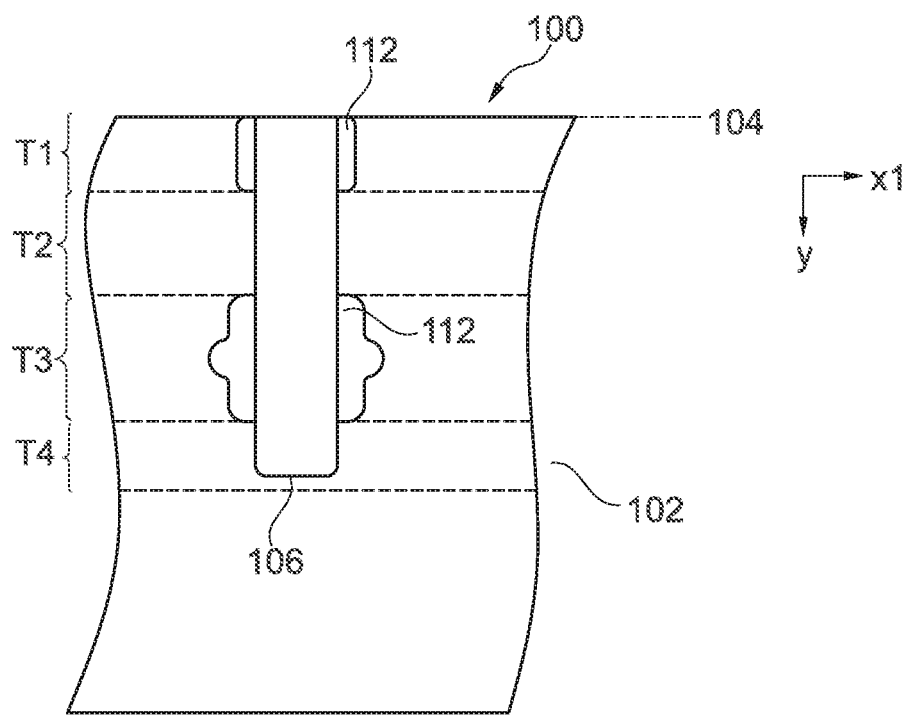
FIGS. 4 to 8 show schematic cross-sectional views of a semiconductor body for illustration of working examples of semiconductor devices that have dopant trenches.

It is likewise possible for the semiconductor area 112 to completely surround the first trench 106 only in one or more depth regions. This is shown by way of example in FIG. 4, wherein the entire depth region of the first trench 106 is divided into a first region T1 at the first surface, an underlying second depth region T2, an underlying third depth region T3 and an underlying fourth (base) depth region T4. The number of depth regions here may be either greater or less. In the second and fourth depth regions T2, T4, the semiconductor area 112 is absent. In the first and third depth regions T1, T3, the semiconductor area is present. In the third depth region, the semiconductor area additionally varies with regard to its lateral extent/its lateral dopant profile. These variants can be combined with one another as desired and matched to the demands of the component. By variation in the dopant source in vertical direction (for example concentration of the first dopant species) and/or variation in the interlayer that acts as diffusion inhibitor layer (e.g. thickness and/or material composition), it is possible, for example, to produce the different dopant profiles in the first lateral direction x1.

Figure 5:
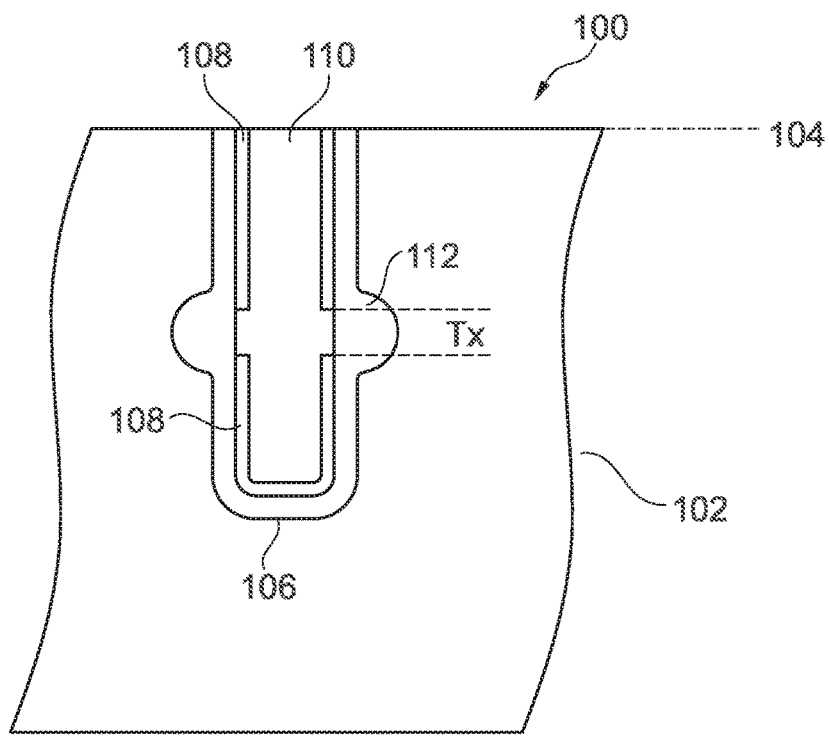

If the interlayer 108 is left out, i.e. omitted, in a depth region Tx, it is possible, for example, to form a contact connection area that connects the semiconductor area 112 to the dopant source 110, where the dopant source itself may serve as electrical contact pathway to the first surface 104. This is shown by way of example in the schematic cross-sectional view of FIG. 5. The contact connection area may, for instance, be a body contact area which, as a result of the leaving-out of the interlayer 108 that serves as diffusion inhibitor layer, is more highly doped than the body area, where body contact area and body area form the semiconductor area 112 shown in FIG. 5.

Figure 6:
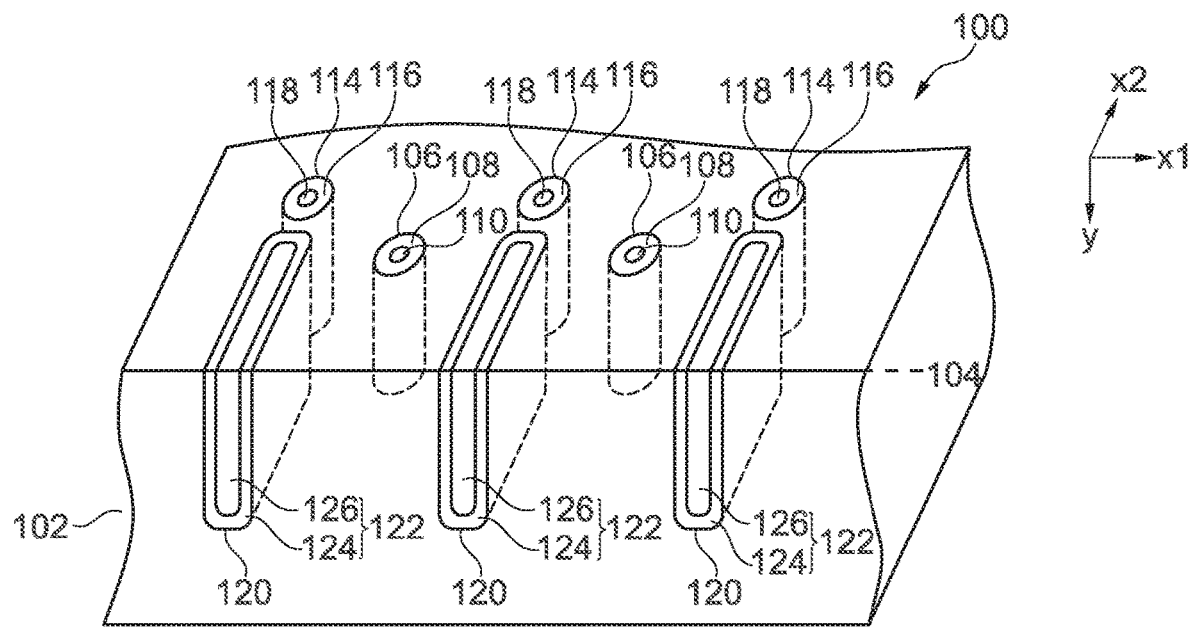

As shown by way of example in the schematic view of FIG. 6, the semiconductor device 100 may additionally have a second trench 114 that extends in the vertical direction y into the semiconductor body 102. A second interlayer 116 and a second dopant source 118 are formed in the second trench 114, where the second interlayer 116 is disposed between the second dopant source 118 and the semiconductor body 102 and the second dopant source 118 includes a second dopant species.

The semiconductor device 100 may additionally have a third trench 120 that extends in the vertical direction y into the semiconductor body 102. A gate structure 122 is formed in the third trench 120, where the gate structure 122 has a gate dielectric 124 and a gate electrode 126.

For a better and clearer illustration, FIG. 6 does not show semiconductor areas that have diffused out of the first and second trenches 106, 114. This illustration could thus also relate to the state prior to the diffusion of the semiconductor areas out of the first and second trenches 106, 114.

In the schematic view of FIG. 6, the first trenches 106 and the third trenches 120 are in an alternate arrangement in the first lateral direction x1 and respective middles of the first trenches 106 and of the third trenches 120 are in an offset arrangement relative to one another in a second lateral direction x2. There are likewise multiple second trenches 114 and multiple first trenches 106 which are in an alternate arrangement with one another in the first lateral direction x1. Here too, respective middles of the second trenches 114 and of the first trenches 106 are in an offset arrangement relative to one another in the second lateral direction x2.

Figure 7:
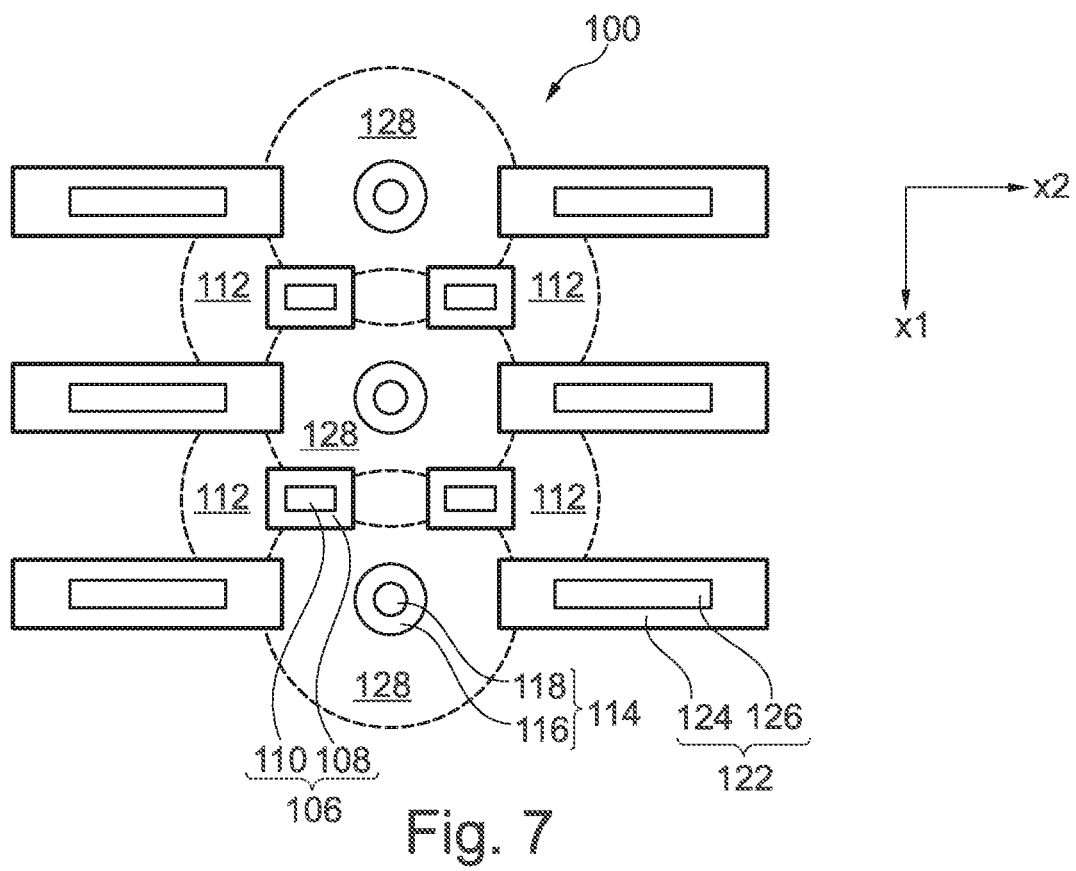

In the schematic top view of the first area 104 in FIG. 7, the semiconductor areas 112, 128 that have diffused out of the first trenches 106 and out of the second trenches 114 have dotted outlines. The region of an overlap of the areas constitutes the area that defines the dopant type. For example, the semiconductor area 112 that has diffused out of the first trench 106 corresponds to a p-doped body area and the semiconductor area 128 that has diffused out of the second trench 114 corresponds to an $n^+$-doped source area that overlaps with and counter-dopes the body area. The second trench 114 is arranged between two third trenches 122 in the second lateral direction x2.

Figure 8:
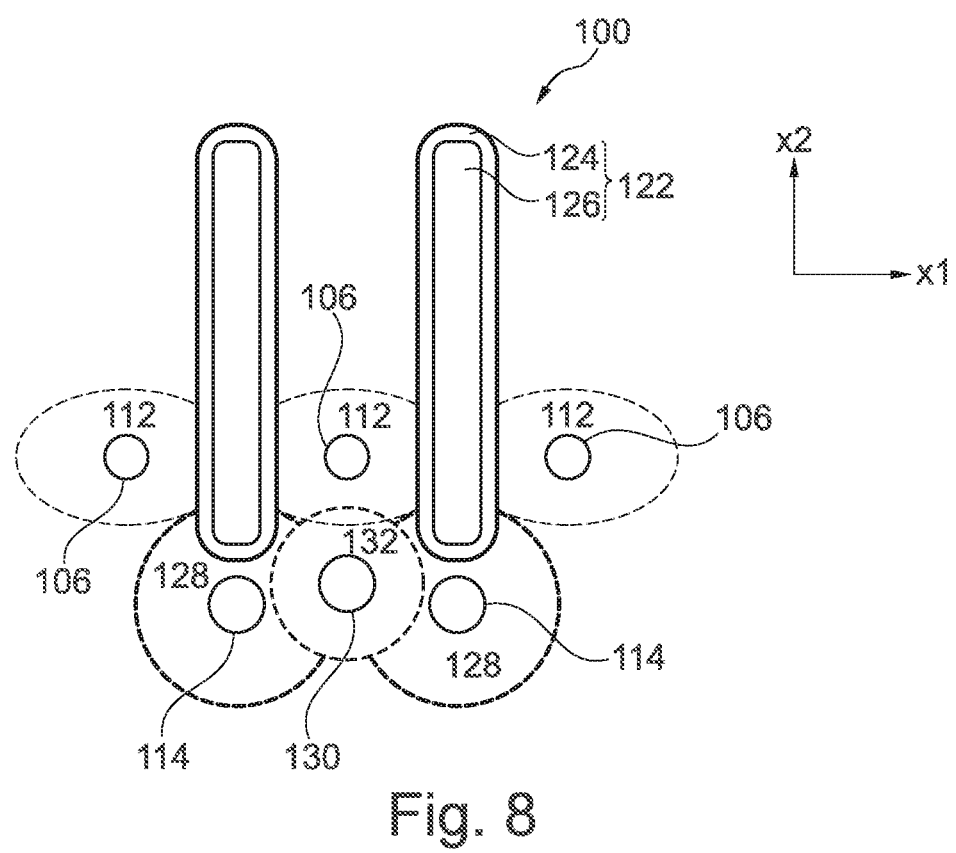

The schematic top view of the first area 104 in FIG. 8 additionally shows a fourth trench 130, out of which diffuses a semiconductor area 132 through a fourth interlayer by means of a fourth dopant source. The semiconductor area 132 may, for example, be a $p^+$-doped body contact area.

Figure 9:
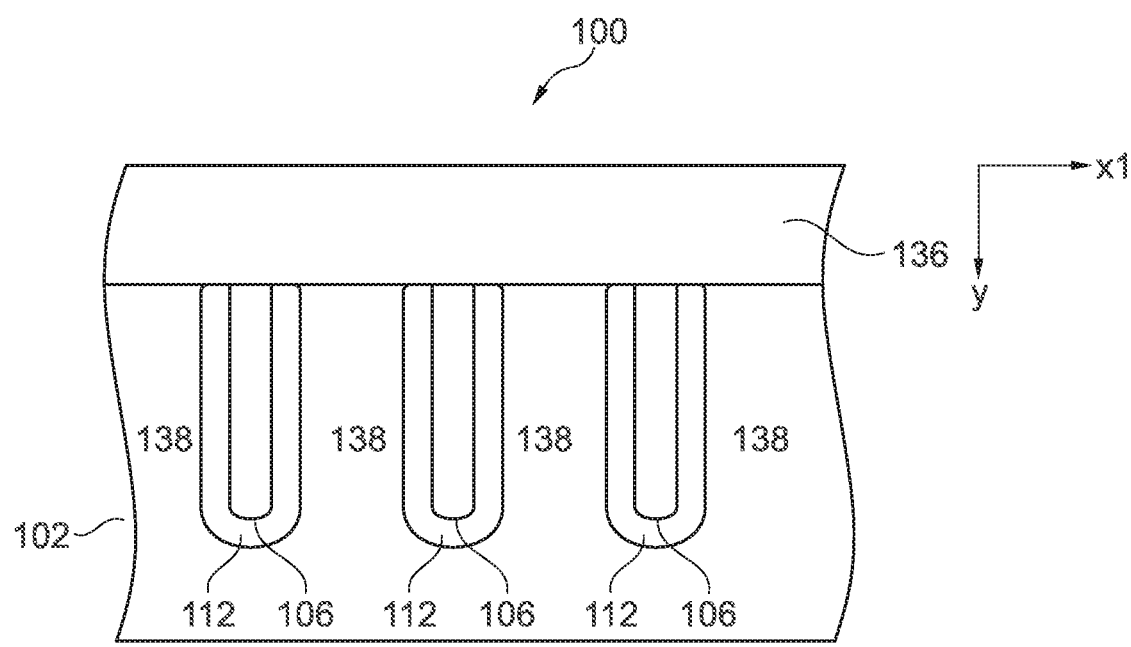
FIG. 9 is a schematic cross-sectional view of a semiconductor body for illustration of a semiconductor device with a dopant trench sealed with a semiconductor layer.

With reference to the schematic cross-sectional view in FIG. 9, a further working example of the semiconductor device 100 is shown in schematic form. The first trench 106 is sealed by means of a semiconductor layer 136 at the surface of the first trench 106. For example, the first trench is overgrown by the semiconductor layer 136. The semiconductor area 112 that diffuses out of the first trench may, for example, be a doped area of a superjunction structure, where the other area of the superjunction structure may be an area 138 that lies between the semiconductor areas 112 and is of the opposite conductivity type from the semiconductor area 112. Above the superjunction structure in the semiconductor area, a component top region of a semiconductor component may be formed, for example field-effect transistor cells with a planar gate or with a trench gate. The sealing of the first trench 106 with the semiconductor layer 136 may precede the outward diffusion of the first dopant species, such that the semiconductor area 112, as a result of the diffusion process, can extend from the top end of the trench 106 into the semiconductor layer 136 above it.

Even though specific embodiments have been illustrated and described here, it is obvious to the person skilled in the art that a multitude of alternative and/or equivalent configurations can be used for the specific embodiments shown and described without departing from the scope of the present invention. This application is intended to cover any adaptations or alterations to the specific embodiments discussed here. The intention is therefore that this invention be limited solely by the patent claims and their equivalents.

What is claimed is:

1. A semiconductor device, comprising:
a semiconductor body having a first surface;
a first trench that extends in a vertical direction into the semiconductor body;
a first interlayer in the first trench;
a first dopant source in the first trench, wherein the first interlayer is disposed between the first dopant source and the semiconductor body and the first dopant source includes a first dopant species;
a semiconductor area doped with the first dopant species and which completely surrounds the first trench at least at a depth in the semiconductor body and adjoins the first trench;
a second trench that extends in the vertical direction into the semiconductor body and is completely spaced apart from the first trench;
a second interlayer in the second trench;
a second dopant source in the second trench, wherein the second interlayer is disposed between the second dopant source and semiconductor body and the second dopant source includes a second dopant species;
a second semiconductor area doped with the second semiconductor species and which completely surrounds the second trench at least at one depth in the semiconductor body and which adjoins the second trench; and
a third trench that extends in the vertical direction into the semiconductor body; and
a gate structure in the third trench, the gate structure comprising a gate dielectric and a gate electrode,
wherein the semiconductor area and the second semiconductor area overlap in a region that comprises the first dopant species from the first dopant source and the second dopant species from the second dopant source,
wherein a thickness of the interlayer varies along a side wall of the first trench, wherein the sidewall extends from the first surface to a bottom of the first trench, and wherein the thickness of the interlayer varies as between two different vertical positions on the sidewall that are each above the bottom of the first trench and below the first surface.

2. The semiconductor device of claim 1, wherein a concentration profile of the first dopant species in the first semiconductor area, in a first lateral direction that extends from the first trench into the semiconductor body, corresponds to a diffusion profile that results from diffusion of the first dopant species from the dopant source through the interlayer into the semiconductor body.

3. The semiconductor device of claim 1, wherein a minimum lateral dimension of the first trench at the first surface is within a range of 20 nm to 200 nm, and wherein a vertical extent of the first trench is within a range of 0.5 μm to 50 μm.

4. The semiconductor device of claim 1, wherein a maximum lateral dimension of the first trench at the first surface is less than a vertical extent of the first trench from the first surface down to a trench base.

5. The semiconductor device of claim 1, wherein the semiconductor device is a field-effect transistor device, and wherein the first semiconductor area is an n-doped or p-doped area of a superjunction structure, or a source area, or a body area, or a body contact area.

6. The semiconductor device of claim 1, wherein the first trench extends from the first surface of the semiconductor body into the semiconductor body or the first trench is sealed by means of a semiconductor layer at a top end of the first trench, and wherein the semiconductor area doped with the first dopant species extends from the top end of the first trench into the semiconductor layer above the first trench.

7. The semiconductor device of claim 1, wherein the first dopant species is different than the second dopant species.

8. The semiconductor device of claim 1, wherein a dopant concentration of the first dopant species is different than a dopant concentration of the second dopant species.

9. The semiconductor device of claim 1, wherein a concentration profile of the first dopant species overlaps with a concentration profile of the second dopant species in a lateral direction.

10. The semiconductor device of claim 1, wherein the first trench and the third trench differ in a lateral extent at the first surface.

11. The semiconductor device of claim 1, wherein the first trench and the third trench differ in a vertical extent into the semiconductor body.

12. The semiconductor device of claim 1, wherein the semiconductor area adjoins a side wall of the third trench.

13. The semiconductor device of claim 1, wherein multiple second trenches and multiple first trenches are in an alternate arrangement in the first lateral direction.

14. The semiconductor device of claim 1, wherein the semiconductor area is a body region of the semiconductor device, and wherein the second semiconductor area is a source region of the semiconductor device.

15. The semiconductor device of claim 1, wherein the semiconductor area extends out from a bottom of the first trench.

16. The semiconductor device of claim 1, wherein a shape of the second trenches along a cross-section parallel to the first surface is different from a shape of the first trenches along the cross-section parallel to the first surface.

17. A semiconductor device, comprising:
a semiconductor body having a first surface;
a first trench that extends in a vertical direction into the semiconductor body;
a first interlayer in the first trench;
a first dopant source in the first trench, wherein the first interlayer is disposed between the first dopant source and the semiconductor body and the first dopant source includes a first dopant species;
a semiconductor area doped with the first dopant species and which completely surrounds the first trench at least at a depth in the semiconductor body and adjoins the first trench;
a second trench that extends in the vertical direction into the semiconductor body and is completely spaced apart from the first trench;
a second interlayer in the second trench;
a second dopant source in the second trench, wherein the second interlayer is disposed between the second dopant source and semiconductor body and the second dopant source includes a second dopant species;
a second semiconductor area doped with the second semiconductor species and which completely surrounds the second trench at least at one depth in the semiconductor body and which adjoins the second trench; and
a third trench that extends in the vertical direction into the semiconductor body; and
a gate structure in the third trench, the gate structure comprising a gate dielectric and a gate electrode,
wherein the semiconductor area and the second semiconductor area overlap in a region that comprises the first dopant species from the first dopant source and the second dopant species from the second dopant source,
wherein multiple first trenches and multiple third trenches are in an alternate arrangement in a first lateral direction, and wherein respective middles of the first trenches and of the third trenches are in an offset arrangement in a second lateral direction.

* * * * *